United States Patent
Nieh et al.

(10) Patent No.: US 11,774,804 B2
(45) Date of Patent: Oct. 3, 2023

(54) DISPLAY DEVICE

(71) Applicant: InnoLux Corporation, Miao-Li County (TW)

(72) Inventors: Chi-Hsuan Nieh, Miao-Li County (TW); Yu-Chien Kao, Miao-Li County (TW); Po-Ju Yang, Miao-Li County (TW); Shih-I Huang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 151 days.

(21) Appl. No.: 17/148,593

(22) Filed: Jan. 14, 2021

(65) Prior Publication Data

US 2021/0132448 A1    May 6, 2021

Related U.S. Application Data

(63) Continuation of application No. 16/368,832, filed on Mar. 28, 2019, now Pat. No. 10,921,649.

(30) Foreign Application Priority Data

May 8, 2018 (CN) .......................... 201810431878.9

(51) Int. Cl.
  *G02F 1/1337* (2006.01)
  *G02F 1/1339* (2006.01)
  *G02F 1/1368* (2006.01)
  *G02F 1/1345* (2006.01)
  *H01L 27/12* (2006.01)
  *G02F 1/1362* (2006.01)

(52) U.S. Cl.
  CPC ...... *G02F 1/133707* (2013.01); *G02F 1/1368* (2013.01); *G02F 1/13394* (2013.01); *G02F 1/13458* (2013.01); *G02F 1/136286* (2013.01); *H01L 27/124* (2013.01)

(58) Field of Classification Search
  CPC ... H01L 27/1214–1296; H01L 27/3244–3279; H01L 27/1237; G02F 2001/13398
  See application file for complete search history.

(56) References Cited

U.S. PATENT DOCUMENTS

2007/0085079 A1* 4/2007 Lee ................. H01L 27/124
                                                                      257/59
2009/0091677 A1   4/2009 Cho
2018/0129091 A1   5/2018 Yao

FOREIGN PATENT DOCUMENTS

CN        107621715 A       1/2018

* cited by examiner

*Primary Examiner* — Julio J Maldonado
*Assistant Examiner* — Stanetta D Isaac
(74) *Attorney, Agent, or Firm* — Winston Hsu

(57) ABSTRACT

A display device comprises a first substrate, a second substrate disposed opposite to the first substrate, a scan line disposed between the first substrate and the second substrate, and a spacer disposed between the scan line and the second substrate. The spacer overlaps the scan line.

16 Claims, 7 Drawing Sheets

DISPLAY DEVICE

CROSS REFERENCE TO RELATED APPLICATIONS

This application is a continuation of U.S. application Ser. No. 16/368,832, filed on Mar. 28, 2019, the disclosure of which is incorporated by reference herein.

BACKGROUND OF THE DISCLOSURE

1. Field of the Disclosure

The present disclosure is related to a display device, and more particularly to a display device with less light leakage.

2. Description of the Prior Art

A flat display device has the characteristics of light weight and thin thickness, and it has gradually become the mainstream product in the market of display devices. It has been applied to home televisions, personal computer displays and portable electronic devices such as cellular phones, digital cameras, and tablet. In some flat display devices, spacers may be disposed between substrates in order to maintain the cell gaps of the substrates. However, during a press test or carry of the display panel, the panel may suffer external pressure which may cause the spacer to displace, resulting in the damage of the film layers on the substrate and light leakage.

SUMMARY OF THE DISCLOSURE

The present disclosure provides a display device, including a first substrate, a second substrate, a first conductive layer, a first insulating layer, a second conductive layer, and at least a spacer. The second substrate and the first substrate are disposed opposite to each other. The first conductive layer is disposed between the first substrate and the second substrate and includes a first portion and a second portion, and the second portion is disposed adjacent to the first portion. The first portion and the second portion have a first distance therebetween. The first insulating layer is disposed between the first conductive layer and the second substrate. The second conductive layer is disposed between the first insulating layer and the second substrate, and the second conductive layer overlaps the second portion. The spacer is disposed between the first insulating layer and the second substrate, and the spacer partially overlaps the first portion. The spacer has a spacer height, and the spacer has a first width at 90% height of the spacer height. A ratio of the first distance to the first width is greater than or equal to 0.2 and less than or equal to 2.

The present disclosure provides a display device, including a first substrate, a second substrate, a first conductive layer, a first insulating layer, a second conductive layer, and at least a spacer. The second substrate and the first substrate are disposed opposite to each other. The first conductive layer is disposed between the first substrate and the second substrate, and includes a first conductive line and a first dummy pad. The first dummy pad is disposed adjacent to the first conductive line. The first insulating layer is disposed between the first conductive layer and the second substrate. The second conductive layer is disposed between the first insulating layer and the second substrate, and includes a conductive pad. The conductive pad overlaps the first dummy pad. The spacer is disposed between the first insulating layer and the second substrate, and the spacer overlaps the first conductive line.

The present disclosure further provides a display device, including a first substrate, a second substrate, a first conductive layer, a first insulating layer, a second conductive layer and at least a spacer. The second substrate and the first substrate are disposed opposite to each other. The first conductive layer is disposed between the first substrate and the second substrate, and includes a first conductive line and a second conductive line, wherein the second conductive line and the first conductive line disposed adjacent to each other. The first insulating layer is disposed between the first conductive layer and the second substrate, and the second conductive layer is disposed between the first insulating layer and the second substrate. The second conductive layer includes a second dummy pad that overlaps the second conductive line. The spacer is disposed between the first substrate and the second substrate and partially overlaps the first conductive line.

These and other objectives of the present disclosure will no doubt become obvious to those of ordinary skill in the art after reading the following detailed description of the embodiment that is illustrated in the various figures and drawings.

DETAILED DESCRIPTION

Figure 1:
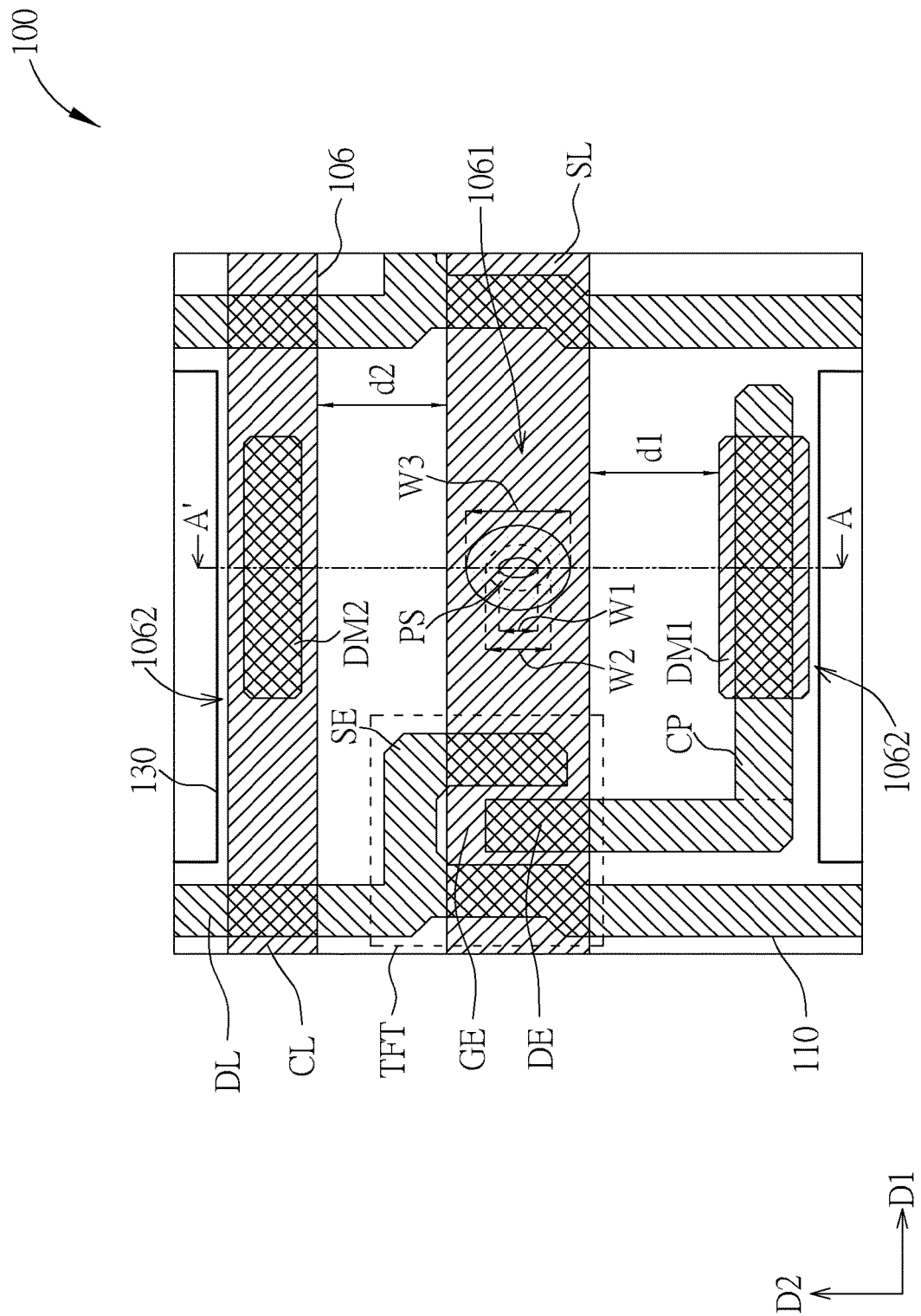
FIG. 1 is a partial schematic top-view diagram of a display device according to a first embodiment of the present disclosure.

The present disclosure may be understood by reference to the following detailed description, taken in conjunction with the drawings as described below. It is noted that the drawings are simplified schematic diagrams, and therefore, the drawings show only the components and combinations associated with the present disclosure, so as to provide a clearer description of the basic architecture or method of implementation of the present disclosure. The components would be more complex in reality. In addition, for explanation, the components shown in the drawings of the present disclosure may not be drawn to scale of the actual number, shape, and dimensions, and the detail and scale can be adjusted according to the design requirements.

Furthermore, when the terms "include", "comprise" and/or "have" are used in the description of the present disclosure, the corresponding features, areas, steps, operations and/or components would be pointed to existence, but not limited to the existence or addition of one or more other features, areas, steps, operations and/or components. When a component (or the variant thereof such as layer of area) is referred to "on another component (or the variant thereof)" or "extend to another component", it may be directly on another component or directly extend to another component, or other component may exist between them. It will be understood that when an element or layer is referred to as being "disposed on" or "connected to" another element or layer, it can be directly dispose on or directly connected to the other element or layer, or intervening elements or layers may be present. In contrast, when an element is referred to as being "directly disposed on" or "directly connected to" another element or layer, there are no intervening elements or layers exist.

On the other hand, when the component is referred to "directly on another component (or the variant thereof)" or "directly extend to another component", there are no intervening components presented therebetween. In addition, when a component is referred to "be coupled to" another component (or the variant thereof), it may be directly connected to the another component, or may be indirectly connected (such as electrically connected) to the another component through other component or components.

It should be noted that the different embodiments described in the following can be replaced, recombined, or mixed with one another to constitute other embodiments without departing from the spirit of the present disclosure.

Figure 2:
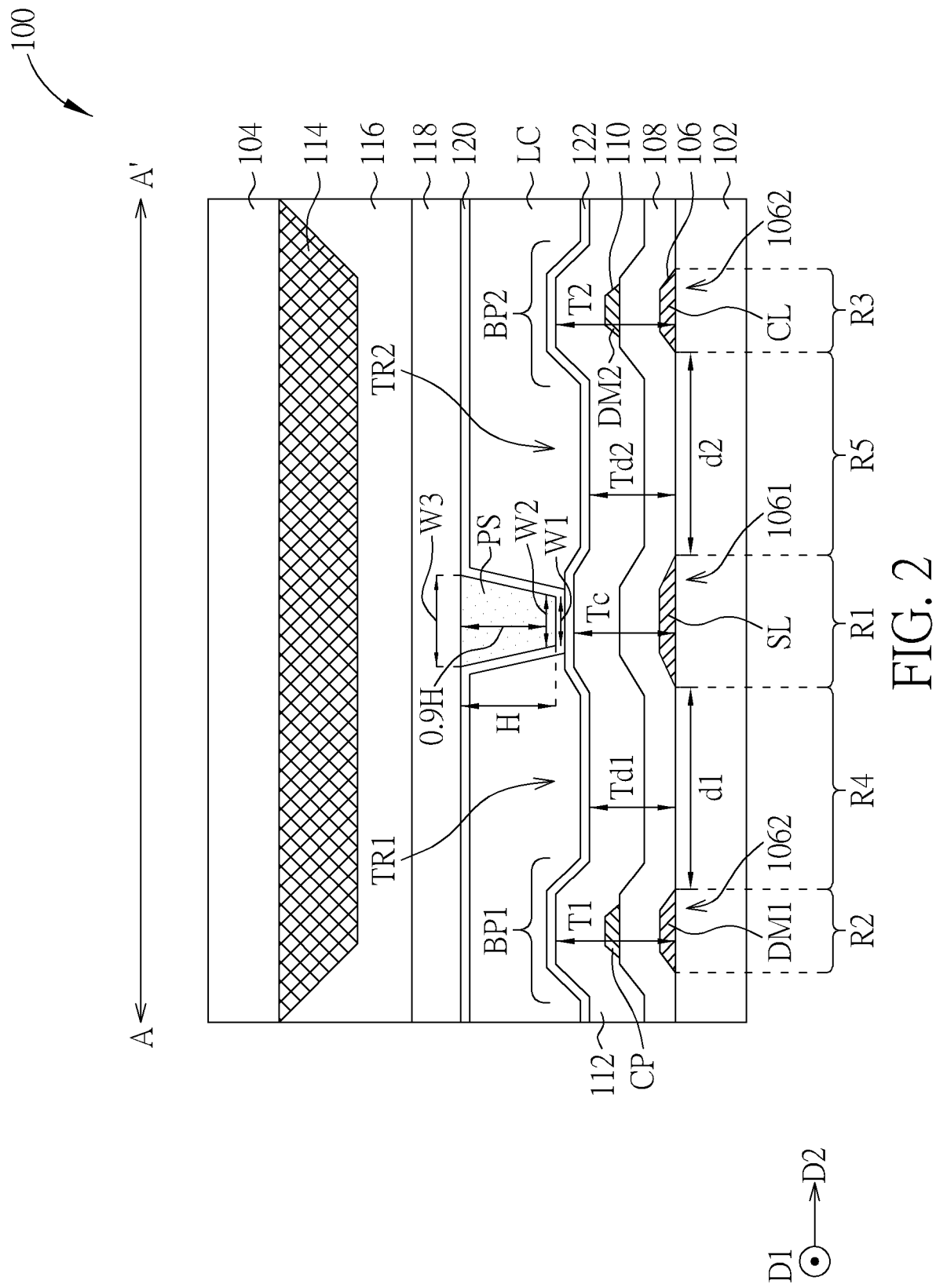
FIG. 2 is a schematic sectional-view diagram of the display device along line A-A' shown in FIG. 1.

Referring to FIG. 1 and FIG. 2, FIG. 1 is a partial schematic top-view diagram of a display device according to a first embodiment of the present disclosure, and FIG. 2 is a schematic sectional-view of the display device along line A-A' shown in FIG. 1. This embodiment provides a display device 100, which may include various types of flat display panel, curved display panel, or flexible display panel. As an example, the display device 100 includes a liquid crystal display panel with liquid crystal material in this embodiment, but not limited thereto. In other embodiments, the display device 100 may include light emitting diodes (LED), mini LEDs, micro LEDs, quantum dot (QD) material, fluorescence material, phosphor material, or any other suitable material, but not limited thereto. In an embodiment, the size of an LED chip may be in a range from about 300 micrometers (μm) to 10 millimeters (mm), the size of a mini LED chip may be in a range from about 100 μm to 300 μm, the size of a micro LED chip may be in a range from about 1 μm to 100 μm, but not limited thereto. The display device 100 includes a first substrate 102 and a second substrate 104, wherein the first substrate 102 and the second substrate 104 are disposed opposite to each other. For example, the first substrate 102 and the second substrate 104 may respectively be a solid substrate such as a glass substrate, a quartz substrate or a sapphire substrate, or a plastic substrate such as a flexible substrate including polyimide (PI), polycarbonate (PC) or polyethylene terephthalate (PET) material, but not limited thereto. A display medium layer LC is disposed between the first substrate 102 and the second substrate 104. When the display device 100 includes a liquid display panel, the display medium layer LC may be a liquid crystal layer with liquid crystal molecules, for instance.

The display device 100 further includes a first conductive layer 106, a first insulating layer 108, a second conductive layer 110 and a spacer PS. The first conductive layer 106 is disposed on the surface of the first substrate 102 and positioned between the first substrate 102 and the second substrate 104. The first conductive layer 106 includes a first conductive line SL and a first dummy pad DM1. The first conductive line SL extends a long a first direction D1. In this embodiment, the first conductive line SL may serve as a scan line of the display device 100, which is used for receiving scan signals. The first conductive line SL may be electrically connected to a gate GE of a transistor TFT, and the gate GE of the transistor TFT may be formed of the first conductive layer 106, but not limited thereto. The first dummy pad DM1 and the first conductive line SL are disposed adjacent to each other, and the first dummy pad DM1 may be floating or grounded. In the present disclosure, "floating" indicates an element is insulated from another element. In the present disclosure, "grounded" indicates an element has an electrical potential of grounded level. The first conductive layer 106 of this embodiment may further include a second conductive line CL, which is disposed adjacent to the first conductive line SL and may extend along the first direction D1. The second conductive line CL may serve as a common electrode line of the display device 100 for receiving common signals for instance, but not limited thereto. For example, the material of the first conductive layer 106 may be one of Mg, Ca, Al, Ag, W, Cu, Ni, Cr, or any combination thereof, but not limited thereto.

The first insulating layer 108 may cover on the first conductive layer 106, positioned between the first conductive layer 106 and the second substrate 104. The first insulating layer 108 may serve as the gate insulating (GI) layer of the transistor TFT for instance. As an example, the first insulating layer 108 may include inorganic insulating material, such as silicon oxide or silicon nitride, but not limited thereto.

The second conductive layer 110 may be disposed above the first insulating layer 108 and positioned between the first insulating layer 108 and the second substrate 104. The second conductive layer 110 includes a conductive pad CP, wherein the conductive pad CP overlaps the first dummy pad DM1. In an embodiment, the conductive pad CP may partially overlaps the first dummy pad DM1, but not limited thereto. In should be noted that the term "overlap" used herein means in a normal direction of the surface of the first substrate 102, two objects have at least some portions that overlaps each other, and the term "overlap" may also represent that the projection pattern on the surface of the first substrate 102 of two objects have at least some portions that overlap each other. The terms "partially overlap" and "overlap" mentioned in other paragraphs or claims may refer to the similar meaning herein, and related description will not be repeated.

In this embodiment, the conductive pad CP may be electrically connected to a drain DE of the transistor TFT. For example, the conductive pad CP may serve as a drain extension that extends along the first direction, and the drain DE may be composed of the second conductive layer 110. The drain DE may have a chamfer angle in a top view of the first substrate 102 (i.e., the top view of the display device 100). The length of the conductive pad CP in the first direction D1 may be greater than the length of the first dummy pad DM1 in the first direction D1, but not limited thereto.

The second conductive layer 110 of this embodiment may further include a second dummy pad DM2 disposed on the second conductive line CL, which overlaps or partially overlaps the second conductive line CL, wherein the second dummy pad DM2 may be floating or grounded. The length of the second dummy pad DM2 in the first direction D1 may be less than the length of the second conductive line CL in the first direction D1, but not limited thereto. The second conductive layer 110 may further include a third conductive line DL which extends along the second direction D2, wherein the second direction D2 is different from the first direction D1, and the second direction D2 in this embodiment is perpendicular to the first direction D1 as an example. The third conductive line DL may serve as a data line for receiving datum signals. The third conductive line DL may be electrically connected to the source SE of the transistor TFT. The source SE may have a chamfer angle in a top view of the first substrate 102 (i.e., the top view of the display device 100). In this embodiment, the source SE of the transistor TFT may be formed of the second conductive layer 110. The material of the second conductive layer 110 may be the same or different from the material of the first conductive layer 106, which may refer to the introduction of the material of the first conductive layer 106 and will not be repeated.

The spacer PS may be disposed between the first substrate 102 and the second substrate 104. The spacer PS of this embodiment is disposed on the surface of the second substrate 104 facing the first substrate 102, forming an inverse cone-shaped part. In one embodiment, the top portion of the spacer PS that is distant from the second substrate 104 may have a round shape and have a topmost point, but not limited thereto. The spacer PS may have a spacer height H, which indicates the distance from the bottom of the spacer PS (the surface of the spacer PS facing the second substrate 104) to the point of the spacer PS most distant from the second substrate 104. In an embodiment, when the spacer PS is direct in contact with the surface of the second substrate 104, the spacer height H may be the distance from the surface of the second substrate 104 to the point of the spacer PS most distant from the second substrate 104. In another embodiment, the spacer PS may be directly disposed on a surface of a layer, such as a passivation layer 118, formed on the surface of the second substrate 104 and in contact with the passivation layer 118. When the spacer PS is directly in contact with the surface of the passivation layer 118, the spacer height H may be the distance from the surface of passivation layer 118 to the point of the spacer PS most distant from the second substrate 104. The spacer height H may be measured along the normal direction of the second substrate 104. The spacer PS may be used for stabilizing the thickness between the first substrate 102 and the second substrate 104. According to this embodiment, the display device 100 may include a plurality of spacers PS. The spacer PS may include inorganic material or organic material, such as organic photoresist material with photo-sensitivity, but not limited thereto.

The display device 100 may further include a second insulating layer 112 disposed between the spacer PS and the first insulating layer 108 or disposed on the second conductive layer 11. The second insulating layer 112 may include inorganic or organic material. As shown in FIG. 2, the region of the surface of the first substrate 102 that has the first conductive line SL may be defined as a first region R1. From the top surface of the second insulating layer 112 in the first region R1 (that is the surface of the second insulating layer 112 distant from the first substrate 102) to the surface of the first substrate 102 may have a first thickness Tc, and the first thickness Tc may be measured along the normal direction of the first substrate 102. In other words, the first thickness Tc represent the distance between the top surface of the second insulating layer 112 corresponding to the first conductive line SL and the first substrate 102. In one embodiment, the first thickness Tc may be a maximum distance from the surface of a substantial planar part of the first region R1 to the surface of the first substrate 102, wherein the planar part is defined by that its surface is substantial parallel to the surface of the first substrate 102.

In the left-side part of FIG. 2, a bump BP1 may be disposed on the first substrate 102, wherein the bump BP1 is formed of the first dummy pad DM1, the first insulating layer 108, the conductive pad CP and the second insulating layer 112 sequentially from bottom to top. The region of the surface of the first substrate 102 having the first dummy pad DM1 may be defined as a second region R2, and the bump BP1 may be disposed to correspond to the second region R2. From the top surface of the second insulating layer 112 (the surface of the second insulating layer 112 distant from the first substrate 102) in the second region R2 to the surface of the first substrate 102 may have a second thickness T1, and the second thickness T1 may be measured along the normal direction of the first substrate 102. In other words, the distance between the top surface of the second insulating layer 112 that corresponds to the first dummy pad DM1 and the first substrate 102 may be defined as the second thickness T1. In one embodiment, the second thickness T1 may be a maximum distance from the surface of a substantial planar part of the second region R2 that corresponds to the conductive pad CP to the surface of the first substrate 102. In other words, the second thickness T1 can be measured in a direction passing through the conductive pad CP and along the normal direction of the substrate 102.

Similarly, the first substrate 102 in the right-side part of FIG. 2 may have a bump BP2 which is formed of the second conductive line CL, the first insulating layer 108, the second dummy pad DM2, and the second insulating layer 112 sequentially from bottom to top. The region of the surface of the first substrate 102 having the second conductive line CL may be defined as a third region R3, and the bump BP2 may be disposed to correspond to the third region R3. A thickness from the top surface of the second insulating layer 112 (that is the surface of the second insulating layer 112 distant from the first substrate 102) in the third region R3 to the first substrate 102 is defined as a third thickness T2, wherein the third thickness T2 can be measured along the normal direction of the first substrate 102. In other words, the distance between the top surface of the second insulating layer 112 that corresponds to the second conductive line CL and the first substrate 102 is defined as the third thickness T2. In one embodiment, the third thickness T2 may be a maximum distance from the surface of a substantial planar part of the third region R3 that corresponds to the second conductive line CL to the surface of the first substrate 102. In other words, the third thickness T2 can be measured in a direction passing through the second conductive line CL and along the normal direction of the first substrate 102. According to this embodiment, the second thickness T1 may be greater than the first thickness Tc, and the third thickness T2 may be greater than the first thickness Tc.

In an embodiment, the region between the first conductive line SL and the first dummy pad DM1 may be defined as the fourth region R4, and a thickness from the top surface of the second insulating layer 112 (that is the surface of the second insulating layer 112 distant from the first substrate 102) in the fourth region R4 to the surface of the first substrate 102 may be defined as a fourth thickness Td1. In other words, the portion of the second insulating layer 112 corresponding to the trench TR1 has the fourth thickness Td1 from its top surface to the surface of the first substrate 102. In one embodiment, the fourth thickness Td1 may be a maximum distance from the surface of a planar part corresponding to the trench TR1 in the fourth region R4 to the surface of the first substrate 102. The first thickness Tc in this embodiment may be greater than the fourth thickness Td1, or the second thickness T1 may be greater than the fourth thickness Td1.

Similarly, the region between the first conductive line SL and the second conductive line CL may be defined as the fifth region R5, and the thickness from the top surface of the second insulating layer 112 (that is the surface of the second insulating layer 112 distant from the first substrate 102) in the fifth region R5 to the surface of the first substrate 102 may be defined as a fifth thickness Td2. In other words, the distance between the top surface of the second insulating layer 112 corresponding to the trench TR2 and the first substrate 102 may be defined as the fifth thickness Td2. The first thickness Tc in this embodiment may be greater than the fifth thickness Td2, or the third thickness T2 may be greater than the fifth thickness Td2.

In such design, the bump BP1 and bump BP2 may serve as the blocking banks of the spacer PS. When the display device 100 suffers an external pressure, such as a press, it may result in that the spacer PS shifts to one of the two sides of the first conductive line SL. Even if the spacer PS shifts toward the first dummy pad DM1, the bump BP1 with a greater thickness can decrease the probability of that the spacer PS further moves to the outer side in the direction from the first conductive line SL to the conductive pad CP. Similarly, even if the spacer PS shifts toward the second conductive line CL, the bump BP2 with a greater thickness can decrease the probability of that the spacer PS further moves to the outer side in the direction from the first conductive line SL to the second conductive line CL.

Furthermore, from the above, the fourth thickness Td1 is less than the second thickness T1 and the first thickness Tc at its two sides, thus the surface of the second insulating layer 112 in the fourth region R4 forms a depressed trench TR1, which is also formed between the first conductive line SL and the first dummy pad DM1. Similarly, the fifth thickness Td2 is less than the third thickness T2 and the first thickness Tc at its two sides, thus the surface of the second insulating layer 112 in the fifth region R5 forms a depressed trench TR2, which is also formed between the first conductive line SL and the second conductive line CL.

In an embodiment, as shown in FIG. 2, the sectional profile of the spacer PS may have an inverse trapezoid shape, and the surface of the spacer PS facing the first substrate 102 may have a spacer width W1 in the second direction D2, wherein the second direction D2 may be perpendicular to extending direction of the first conductive line SL. The spacer width W1 of this embodiment may be less than a first distance d1 between the first dummy pad DM1 and the first conductive line SL, wherein the first distance d1 may be the smallest distance between the first dummy pad DM1 and the first conductive line SL. Similarly, the spacer width W1 in this embodiment may be less than a second distance d2 between the second conductive line CL and the first conductive line SL, wherein the second distance d2 may be the smallest distance between the second conductive line CL and the first conductive line SL. The first distance d1 and the second distance d2 may be measured along the second direction D2. Accordingly, even though an external press makes the spacer PS shift toward left-side or right-side, the spacer PS may be trapped in one of the trenches TR1, TR2 at its two sides and it is more difficult for the spacer PS to move forward, thus light leakage issue may be mitigated.

In another embodiment of the present disclosure, it is not limited that the first distance d1 must be greater than the spacer width W1; however, the spacer PS may have a first width W2 at the 90% height of the spacer height H (labeled by 0.9H) in the second direction D2, and a ratio of the first distance d1 to the first width W2 may be in a range greater than or equal to 0.2 and less than or equal to 2.

Furthermore, the bottom of the spacer PS facing the second substrate 104 may have a bottom width W3 in the second direction D2, and this embodiment takes the bottom width W3 being greater than the first width W2 and spacer width W1 as an example, but not limited thereto. In another aspect, in a variant embodiment, it is not limited that the second distance d2 must be greater than the spacer width W1, but a ratio of the second distance d2 to the first width W2 may be in a range greater than or equal to 0.2 and less than or equal to 2. Moreover, this embodiment may have a design that a ratio of the first distance d1 to the first width W2 may be in a range greater than or equal to 0.8 and less than or equal to 1.2, and a ratio of the second distance d2 to the first width W2 may be in a range greater than or equal to 0.8 and less than or equal to 1.2. The above-mentioned design enables at least a portion of the spacer PS to fall into the trench TR1 in the fourth region R4 or fall into the trench TR2 in the fifth region R5 when it moves toward the two sides of the first conductive line SL, rather than move forward to the outer sides, so as to decrease light leakage.

The display device 100 of this embodiment further includes a light-shielding layer 114 on the surface of the second substrate 104. The light-shielding layer may be, but not limited to, a black matrix layer or may include other materials that can block light thereto. The light-shielding layer 114 may be disposed in the region other than the pixel regions 130 (or aperture region) of the display device 100 to reduce the probability of light of the pixel regions 130 being shielded by the light-shielding layer 114. In an embodiment, one pixel region 130 may imply the light emitting region of a pixel or sub-pixel emits light. The pixel region 130 may also imply the region defined by the opening of the light-shielding layer 114. In this embodiment, the light-shielding layer 114 may be disposed to correspond to the first conductive line SL, the first dummy pad DM1, the second dummy pad DM2 and/or the transistor TFT; that is the light-shielding layer 114 may cover the bump BP1, bump BP2, the first region R1, the second region R2, the third region R3, the fourth region R4 and/or the fifth region R5, but not limited thereto.

The display device 100 may further include a color filter layer 116 and a passivation layer 118 sequentially disposed on the surface of the light-shielding layer 114. When the display device 100 is a liquid crystal display device, the display device 100 may further include a first alignment layer 122 and a second alignment layer 120 disposed corresponding to the first substrate 102 and the second substrate 104 respectively. For example, the first alignment layer 122 may cover the surface of the second insulating layer 112, and the second alignment layer 120 may cover the surfaces of the passivation layer 118 and the spacer PS. In this embodiment, the first alignment layer 122 is disposed between the spacer PS and the second insulating layer 112, and the second alignment layer 120 is disposed between the spacer PS and the first alignment layer 122, but not limited thereto. The first alignment layer 122 and the second alignment layer 120 may provide aligning-arrangement functions to the liquid crystal molecules. In this embodiment, the design of the trench TR1, the trench TR2, the bump BP1 and/or bump BP2 mitigates the spacer PS to move to the outer sides of the bump BP1 and/or bump BP2 to scrape against the film layers at two sides of the first conductive line SL, such as the first alignment layer 122. Therefore, the liquid crystal molecules may be arranged and aligned more effectively, so as to mitigate light leakage.

Referring to FIG. 3 to FIG. 7, in other variant embodiments of the present disclosure, it can be designed that only one side of the first conductive line SL has the bump BP1 or bump BP2 being disposed, which means it is not needed to dispose the bump BP1 and the bump BP2 at the same time. In other words, the first dummy pad DM1 and the second dummy pad DM2 do not necessarily need to exist at the same time. The disposition of the bump BP1 or bump BP2 may be determined according to the location of the first conductive line SL and the spacer PS on the display device 100 that influences the shift orientation tendency of the spacer PS when it suffers external pressure, so as to design which one among the bump BP1 and the bump BP2 should be disposed for blocking the displace of the spacer PS.

In addition, although the above embodiments describe the examples in which the spacer PS overlaps the first conductive line SL, in some other embodiments, the portion of the first conductive layer 106 overlapped by the spacer PS may not have the function of conductive line. In this embodiment, it can be considered that the spacer PS at least partially overlaps a first portion 1061 of the first conductive layer 106 and the first conductive layer 106 may further include a second portion 1062 positioned adjacent to the first portion 1061, wherein a bump BP1 or a bump BP2 is formed at the position of the second portion 1062.

In other explanation, the display device 100 of this embodiment includes the first substrate 102, the second substrate 104, the first conductive layer 106, the first insulating layer 108, the second conductive layer 110 and the spacer PS, wherein the first conductive layer 106 includes the first portion 1061 (such as the first conductive line SL) and the second portion 1062 (such as the first dummy pad DM1 or the second conductive line CL, and the first dummy pad DM1 is used as the example) disposed adjacent to the first portion 1061, and the first portion 1061 and the second portion 1062 has a distance therebetween, such as the first distance d1 (or the second distance d2). The first insulating layer 108 is disposed on the first conductive layer 106. The second conductive layer 110 (such as including the conductive pad CP or the second dummy pad DM2) is disposed on the first insulating layer 108. The second conductive layer 110 overlaps the second portion 1062. The spacer PS is disposed between the first substrate 102 and the second substrate 104 and overlaps the first portion 1061. The spacer PS has a first width W2 at the 90% height 0.9H of the spacer height H, and the ratio of the first distance d1 (or the second distance d2) to the first width W2 may be in a range greater than or equal to 0.2 and less than or equal to 2.

In addition, as mentioned above, when the first portion 1061 in this embodiment serves as a portion of a scan line, it can receive a scan signal, when the second portion 1062 serves as the first dummy pad DM1, it is floating or grounded, and when the second portion 1062 serves as the second conductive line CL, it can receive a common signal. The second dummy pad DM2 of the second conductive layer 110 may partially overlap the second portion 1062, wherein the second dummy pad DM2 may be floating or grounded.

The first thickness Tc is defined from the top surface of the second insulating layer 112 corresponding to the first portion 1061 to the first substrate 102 is, and the second thickness T1 (or the third thickness T2) is defined from the top surface of the second insulating layer 112 corresponding to the second portion 1062 to the first substrate 102 is, wherein the second thickness T1 (or the third thickness T2) is greater than the first thickness Tc. In addition, a trench TR1 (or the trench TR2) may be formed between the first portion 1061 and the second portion 1062, the fourth thickness Td1 (the fifth thickness Td2) is defined from the top surface of the second insulating layer 112 corresponding to the trench TR1 (or the trench TR2) to the first substrate 102, and the fourth thickness Td1 (or the fifth thickness Td2) is less than the first thickness Tc.

Figure 3:
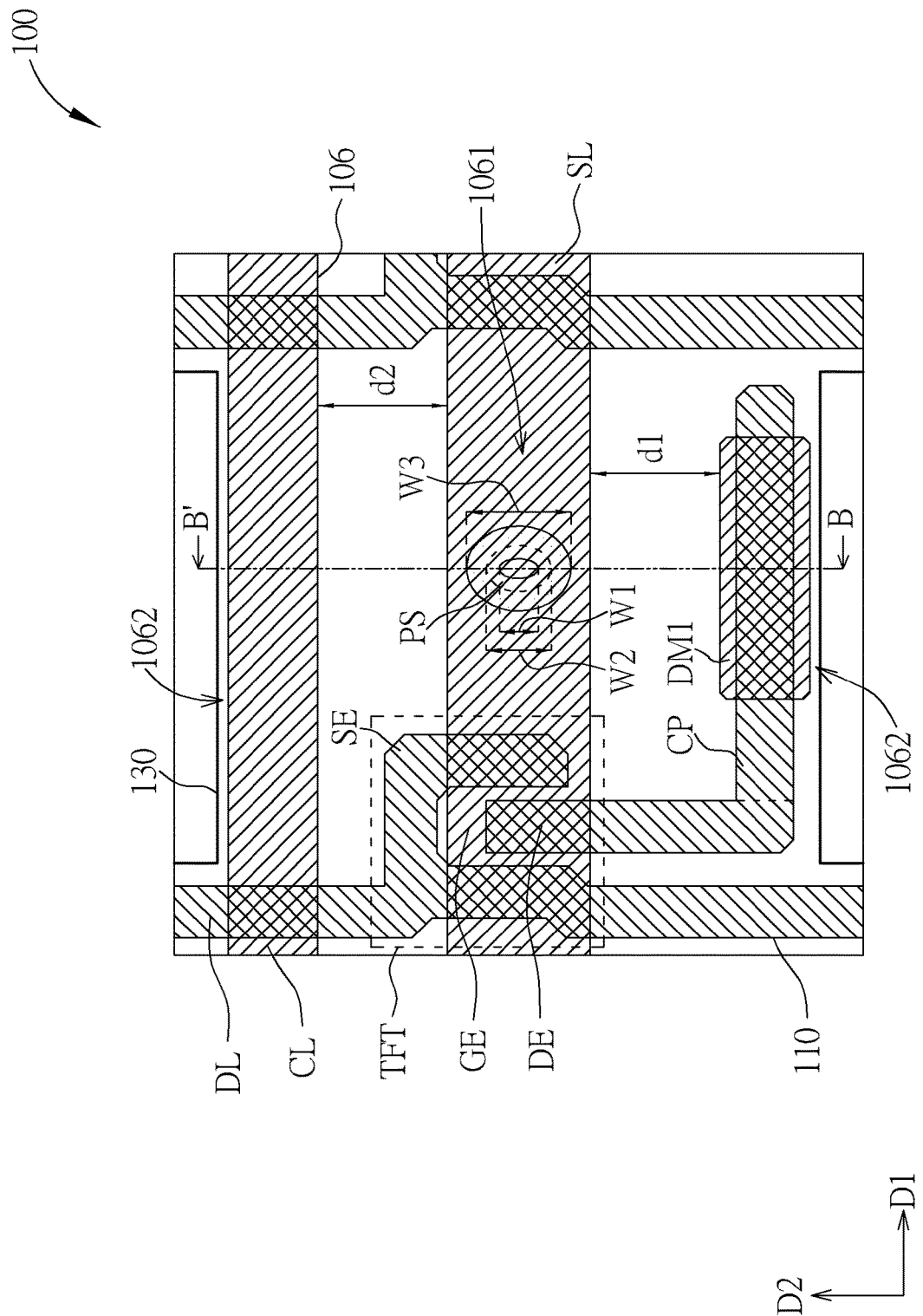
FIG. 3 is a partial schematic top-view of a display device according to a second embodiment of the present disclosure.
Figure 4:
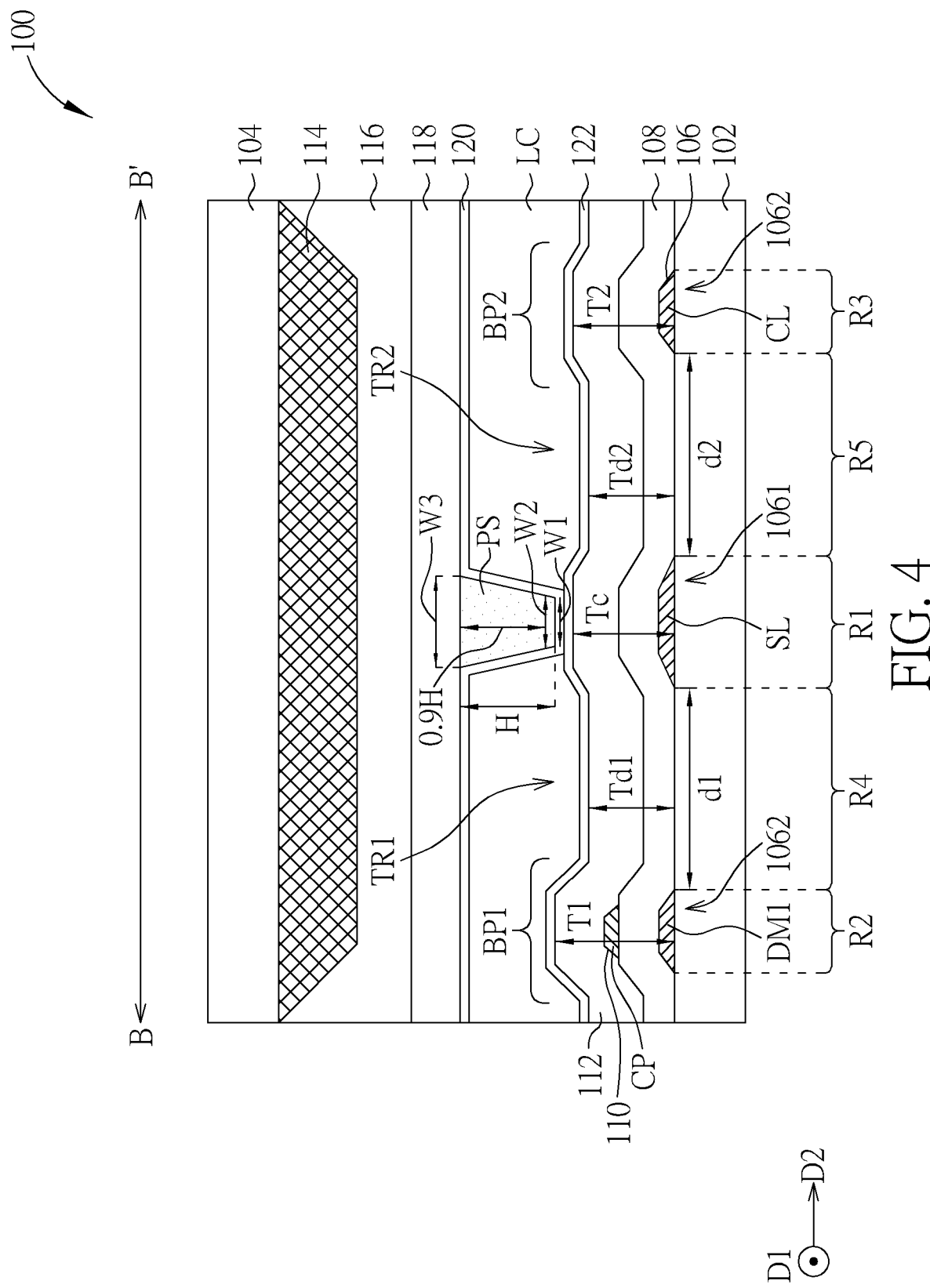
FIG. 4 is a schematic sectional-view of the display device along line B-B' shown in FIG. 3.

Referring to FIG. 3 and FIG. 4, FIG. 3 is a partial schematic top-view of a display device according to a second embodiment of the present disclosure, and FIG. 4 is a schematic sectional view of the display device along line B-B' shown in FIG. 3. This embodiment is different from the first embodiment in that the third region R3 may not have the second dummy pad DM2, thus the third thickness T2 of the bump BP2 is slightly less than the second thickness T1 of the bump BP1. According to this embodiment, when the disposition parameter (such as disposition location) makes the spacer PS have a tendency to shift toward one side of the first conductive line SL (such as toward the left side in FIG. 4), the second dummy pad DM2 may not be necessarily disposed on the second conductive line CL at the other side of the first conductive line SL (such as the right side of FIG. 4), and only the thickness of the bump at the shifting side of the spacer PS is needed to be increased, such as making the second thickness T1 of the bump BP1 in FIG. 4 be greater than the first thickness Tc, such that the bump BP1 may form a blocking bank to reduce the probability that the spacer PS keeps on moving forward by surpassing the bump BP1. In this embodiment, the third thickness T2 may be approximately the same as the first thickness Tc, but not limited thereto.

Figure 5:
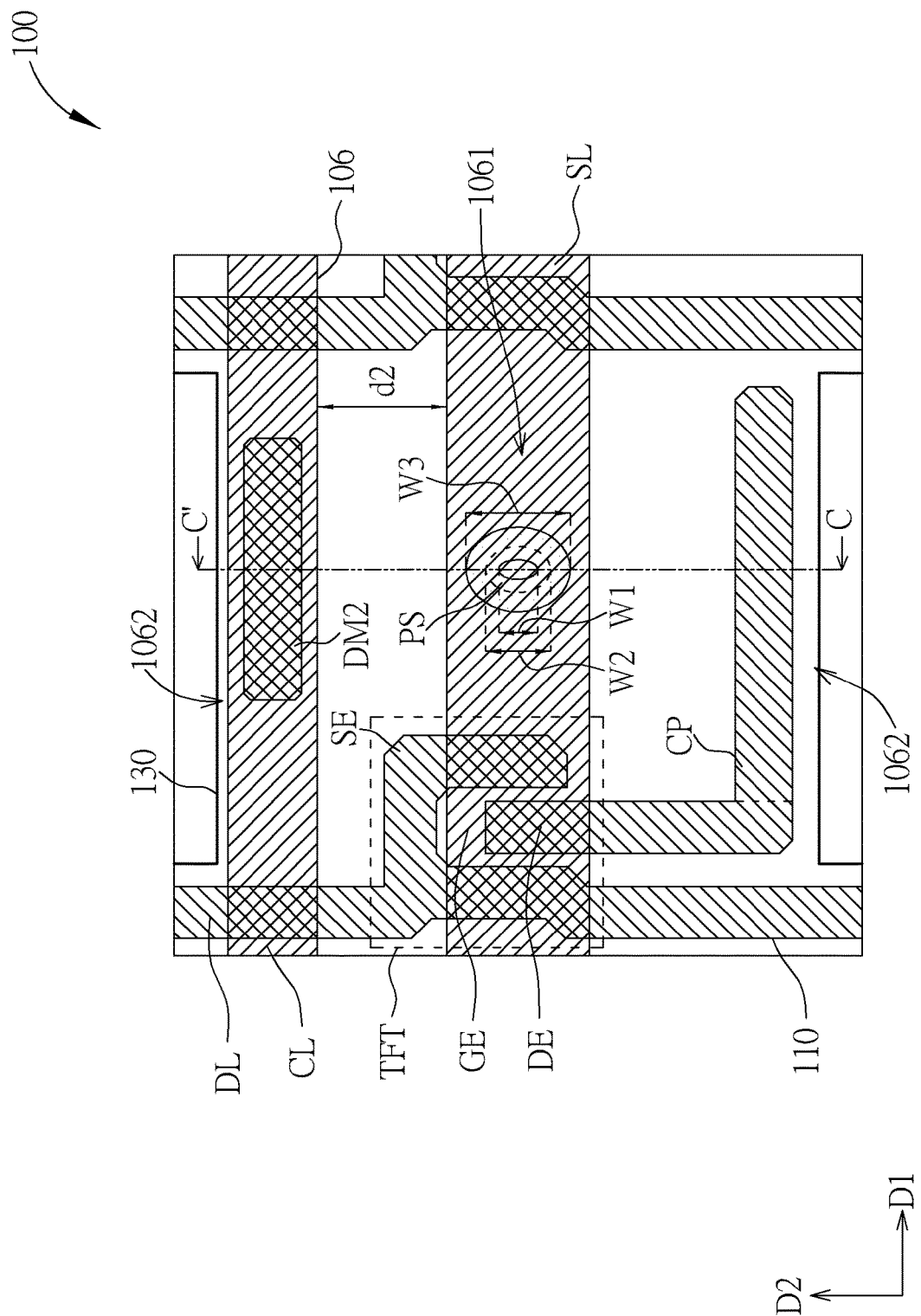
FIG. 5 is a partial schematic top-view diagram of a display device according to a third embodiment of the present disclosure.
Figure 6:
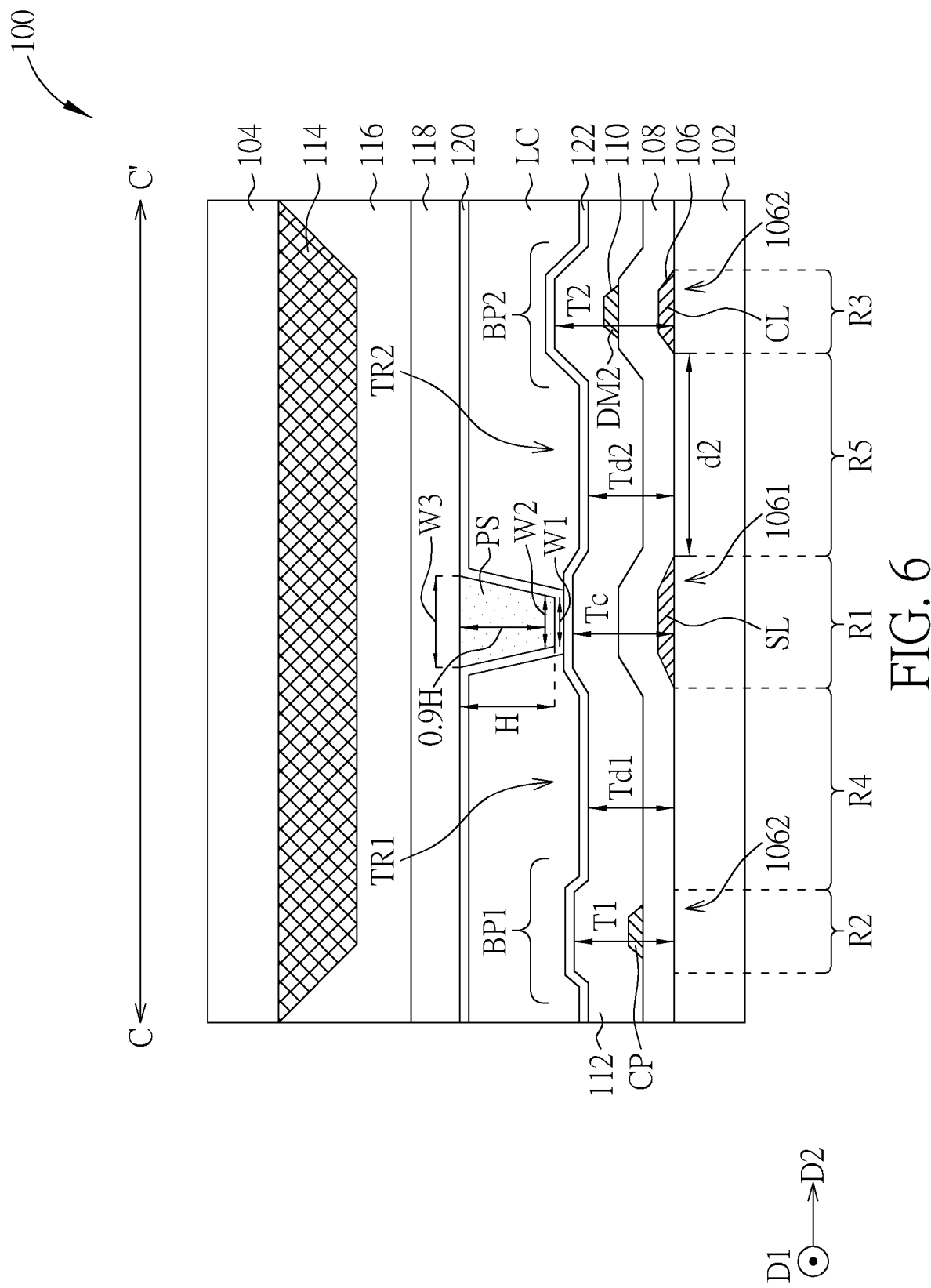
FIG. 6 is a schematic sectional-view diagram of the display device along line C-C' shown in FIG. 5.

Referring to FIG. 5 and FIG. 6, FIG. 5 is a partial schematic top-view diagram of a display device according to a third embodiment of the present disclosure, and FIG. 6 is a schematic sectional-view diagram of the display device along line C-C' shown in FIG. 5. This embodiment is different from the first embodiment in that the second region R2 may not have the first dummy pad DM1, thus the second thickness T1 of the bump BP1 is slightly less than the third thickness T2 of the bump BP2. According to this embodiment, when the disposition parameter (such as disposition location) makes the spacer PS have a tendency to shift toward one side of the first conductive line SL (such as toward the right side in FIG. 6), the first dummy pad DM1 may not be necessarily disposed below the conductive pad CP at the other side of the first conductive line SL (such as the left side of FIG. 6), and only the thickness of the bump at the shifting side of the spacer PS is needed to be increased, such as making the third thickness T2 of the bump BP2 in FIG. 6 be greater than the first thickness Tc, such that the bump BP2 may form a blocking bank to reduce the probability that the spacer PS keeps on moving forward by surpassing the bump BP2. In this embodiment, the second thickness T1 may be approximately the same as the first thickness Tc, but not limited thereto.

Figure 7:
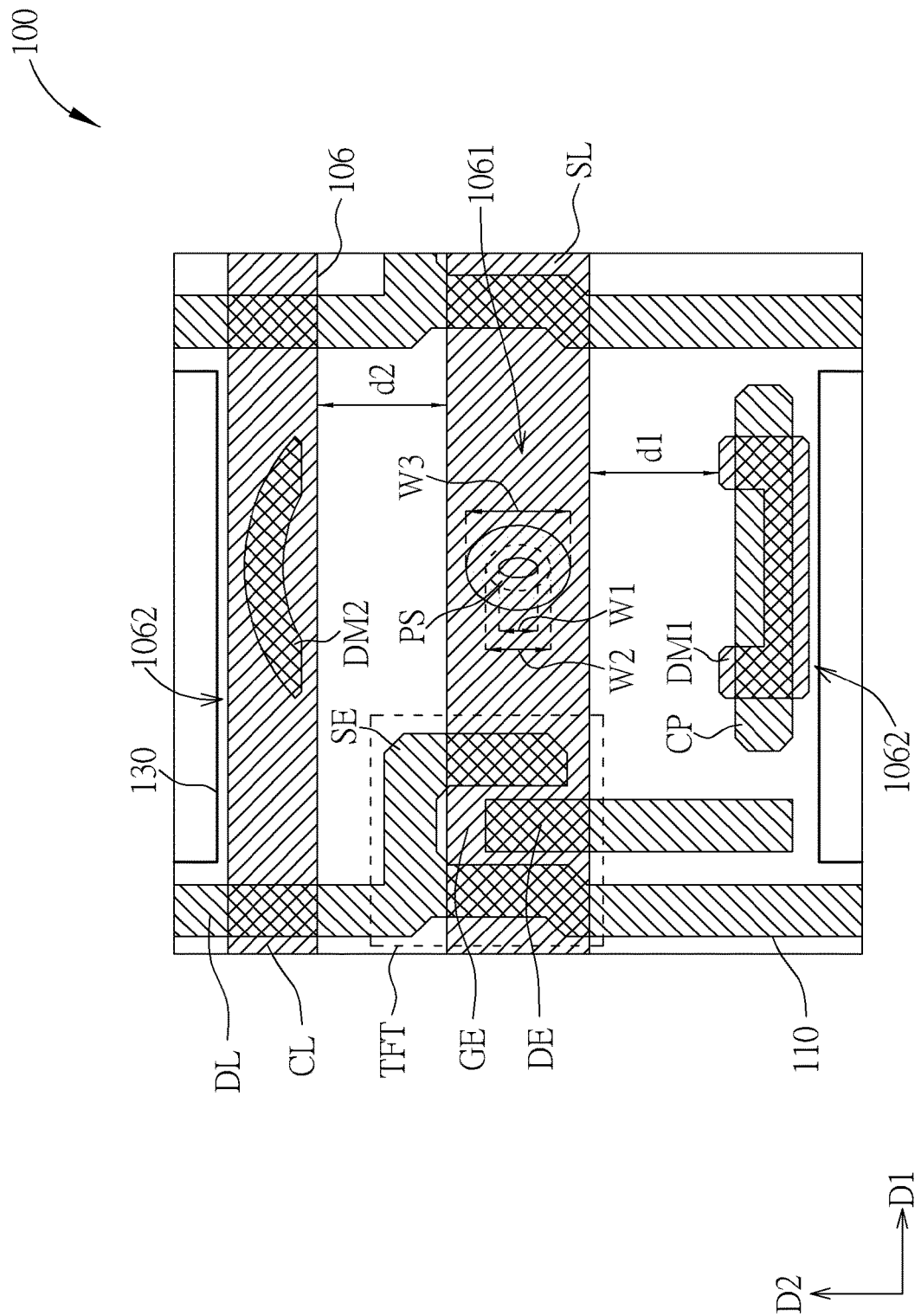
FIG. 7 is a partial schematic top-view diagram of a display device according to a fourth embodiment of the present disclosure.

Referring to FIG. 7, FIG. 7 is a partial schematic top-view diagram of a display device according to a fourth embodiment of the present disclosure. This embodiment is different from the previous embodiments mainly in that the conductive pad CP is not connected to the drain DE, which means the conductive pad CP is floating. In addition, the shapes of the dummy pads are not limited to rectangles or strips and may be any suitable shapes, and all the shapes of the dummy pad is not needed to be identical. For example, the first dummy pad DM1 has a "U" shape and the second dummy pad DM2 has a curved shape this embodiment, but not limited thereto.

From the above, according to the present disclosure, the conductive pad and the first dummy electrode and/or the second conductive line and the second dummy pad are disposed near the spacer at the same time through the first conductive layer and the second conductive layer, thus one or more bumps can be formed at one or two sides of the spacer and/or the trenches with specific sizes can be formed between the spacer and the bump, so as to limit the shifting margin of the spacer. The issues of scraping the film layers on the surface of the substrate caused by the shifting of the spacer can be mitigated, or the light leakage resulted from the scraping-damaged film layers may be decreased. In such design, the whole compression resistivity of the display device or display performance of the product can be increased.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
   a first substrate;
   a second substrate disposed opposite to the first substrate;
   a scan line disposed between the first substrate and the second substrate;
   a common electrode line disposed adjacent to the scan line, wherein the scan line and the common electrode line are comprised in a same layer;
   a spacer disposed between the scan line and the second substrate, wherein the spacer overlaps the scan line;
   a first insulating layer disposed between the scan line and the spacer;
   a second insulating layer disposed between the first insulating layer and the spacer; and
   a dummy pad disposed between the first insulating layer and the second insulating layer, wherein the dummy pad overlaps the common electrode line.

2. The display device of claim 1, wherein the common electrode line and the scan line extend along a same direction.

3. The display device of claim 1, wherein a surface of the spacer facing the first substrate has a spacer width, a surface of the spacer facing the second substrate has a bottom width, and the bottom width is greater than the spacer width.

4. The display device of claim 1, further comprising a thin film transistor electrically connected to the scan line, wherein the thin film transistor comprises a source and the source has a chamfer angle in a top view of the first substrate.

5. The display device of claim 1, further comprising:
   another dummy pad disposed adjacent to the scan line, wherein the dummy pad is disposed adjacent to the scan line and at a side of the scan line opposite to the another dummy pad.

6. The display device of claim 5, wherein the another dummy pad and the scan line are formed of a first conductive layer, and the dummy pad is formed of a second conductive layer different from the first conductive layer.

7. A display device, comprising:
   a first substrate;
   a second substrate disposed opposite to the first substrate;
   a first conductive layer disposed between the first substrate and the second substrate, the first conductive layer comprising a first conductive line and a second conductive line, and the second conductive line being disposed adjacent to the first conductive line;
   a first insulating layer disposed between the first conductive layer and the second substrate;
   a second conductive layer disposed between the first insulating layer and the second substrate, wherein the second conductive layer comprises a dummy pad, and the dummy pad overlaps the second conductive line; and
   a spacer, disposed between the first insulating layer and the second substrate, wherein the spacer overlaps the first conductive line in a normal direction of a surface of the first substrate.

8. The display device of claim 7, further comprising a second insulating layer disposed between the first insulating layer and the spacer.

9. The display device of claim 8, wherein a thickness from a top surface of the second insulating layer corresponding to the first conductive line to the first substrate is defined as a first thickness, a thickness from a top surface of the second insulating layer corresponding to the second conductive line to the first substrate is defined as a second thickness, and the second thickness is greater than the first thickness.

10. The display device of claim 9, wherein a trench is formed between the first conductive line and the second conductive line, a thickness from a top surface of the second insulating layer corresponding to the trench to the first substrate is defined as a third thickness, and the third thickness is less than the first thickness.

11. The display device of claim 7, wherein the dummy pad is floating or grounded.

12. The display device of claim 7, wherein the second conductive line is a common electrode line.

13. The display device of claim 12, wherein the second conductive line is used for receiving a common signal.

14. The display device of claim 7, wherein the first conductive line is a scan line.

15. The display device of claim 7, wherein the first conductive layer comprises another dummy pad disposed at a side of the first conductive line opposite to the second conductive line, and the another dummy pad is floating or grounded.

16. The display device of claim 7, wherein the first conductive line and the second conductive line extend along a same direction.

* * * * *